United States Patent
Yang (10) Patent No.: US 9,070,451 B1
(45) Date of Patent: *Jun. 30, 2015

(54) MODIFYING DATA STORED IN A MULTIPLE-WRITE FLASH MEMORY CELL

(71) Applicant: Marvell International Ltd., Hamilton (BM)

(72) Inventor: Xueshi Yang, Cupertino, CA (US)

(73) Assignee: Marvell International Ltd., Hamilton (BM)

(*) Notice: Subject to any disclaimer, the term of this patent is extended or adjusted under 35 U.S.C. 154(b) by 0 days.

This patent is subject to a terminal disclaimer.

(21) Appl. No.: 14/021,752

(22) Filed: Sep. 9, 2013

Related U.S. Application Data (63) Continuation of application No. 13/406,756, filed on Feb. 28, 2012, now Pat. No. 8,533,386, which is a continuation of application No. 12/396,250, filed on Mar. 2, 2009, now Pat. No. 8,131,915.

(60) Provisional application No. 61/044,251, filed on Apr. 11, 2008.

(51) Int. Cl.
*G06F 13/00* (2006.01)
*G11C 16/10* (2006.01)

(52) U.S. Cl.
CPC ..................................... *G11C 16/10* (2013.01)

(58) Field of Classification Search
USPC ......... 711/103, 152, 163; 365/185.03, 185.23
See application file for complete search history.

(56) References Cited

U.S. PATENT DOCUMENTS

| | | | |
|---|---|---|---|
| 4,611,299 A | 9/1986 | Hori et al. | |
| 4,823,340 A | 4/1989 | Grassman et al. | |
| 5,260,905 A | 11/1993 | Mori | |
| 5,307,343 A | 4/1994 | Bostica et al. | |
| 5,440,523 A | 8/1995 | Joffe | |
| 5,680,595 A | 10/1997 | Thomann et al. | |
| 5,701,517 A | 12/1997 | Carpenter | |
| 5,719,890 A | 2/1998 | Thomman et al. | |
| 5,778,007 A | 7/1998 | Thomann et al. | |
| 5,802,131 A | 9/1998 | Morzano | |
| 5,815,447 A | 9/1998 | Thomann | |

(Continued)

FOREIGN PATENT DOCUMENTS

| | | |
|---|---|---|
| FR | 2779843 | 12/1999 |
| JP | 1162294 | 6/1989 |

(Continued)

OTHER PUBLICATIONS

"Non-Final Office Action", U.S. Appl. No. 12/332,870, Feb. 7, 2014, 19 pages.

(Continued)

*Primary Examiner* — Reba I Elmore (57) ABSTRACT

Flash memory stored data modification is described. In embodiments, a flash memory system includes flash memory and a memory controller that manages data write and erase operations to the flash memory. The flash memory includes a first flash memory region of single-write flash memory cells that are each configured for a data write operation and a corresponding erase operation before a subsequent data write operation. The flash memory also includes a second flash memory region of multiple-write flash memory cells that are each configured for multiple data write operations before an erase operation.

20 Claims, 5 Drawing Sheets

(56) References Cited

U.S. PATENT DOCUMENTS

| | | |
|---|---|---|
| 5,864,504 A | 1/1999 | Tanzawa et al. |
| 5,875,470 A | 2/1999 | Dreibelbis et al. |
| 5,953,340 A | 9/1999 | Scott et al. |
| 5,996,051 A | 11/1999 | Mergard |
| 6,000,006 A | 12/1999 | Bruce et al. |
| 6,016,273 A | 1/2000 | Seki et al. |
| 6,021,086 A | 2/2000 | Joffe et al. |
| 6,034,957 A | 3/2000 | Haddock et al. |
| 6,067,301 A | 5/2000 | Aatresh |
| 6,081,528 A | 6/2000 | Thomann |
| 6,115,389 A | 9/2000 | Mahale et al. |
| 6,160,814 A | 12/2000 | Ren et al. |
| 6,167,491 A | 12/2000 | McAlpine |
| 6,216,205 B1 | 4/2001 | Chin et al. |
| 6,230,191 B1 | 5/2001 | Walker |
| 6,370,624 B1 | 4/2002 | Ajanovic et al. |
| 6,446,173 B1 | 9/2002 | Pham |
| 6,487,207 B1 | 11/2002 | Thomann |
| 6,535,939 B1 | 3/2003 | Arimilli et al. |
| 6,535,963 B1 | 3/2003 | Rivers |
| 6,539,467 B1 | 3/2003 | Anderson et al. |
| 6,539,488 B1 | 3/2003 | Tota et al. |
| 6,567,304 B1 | 5/2003 | Kleveland |
| 6,615,324 B1 | 9/2003 | Fernald |
| 6,618,390 B1 | 9/2003 | Erimli et al. |
| 6,712,704 B2 | 3/2004 | Elliott |
| 6,714,643 B1 | 3/2004 | Gargeya et al. |
| 6,717,847 B2 | 4/2004 | Chen |
| 6,732,184 B1 | 5/2004 | Merchant et al. |
| 6,735,773 B1 | 5/2004 | Trinh et al. |
| 6,741,589 B1 | 5/2004 | Sang et al. |
| 6,785,272 B1 | 8/2004 | Sugihara |
| 6,876,702 B1 | 4/2005 | Hui et al. |
| 6,886,120 B2 | 4/2005 | Yamazaki |
| 7,038,950 B1 | 5/2006 | Hamilton et al. |
| 7,039,781 B2 | 5/2006 | Iwata et al. |
| 7,068,651 B2 | 6/2006 | Schmidt et al. |
| 7,075,827 B2 | 7/2006 | Aoyama et al. |
| 7,076,631 B2 | 7/2006 | Herron |
| 7,099,325 B1 | 8/2006 | Kaniz et al. |
| 7,130,308 B2 | 10/2006 | Haddock et al. |
| 7,136,953 B1 | 11/2006 | Bisson et al. |
| 7,149,834 B2 | 12/2006 | Peters et al. |
| 7,185,132 B2 | 2/2007 | Tang |
| 7,197,591 B2 | 3/2007 | Kwa et al. |
| 7,249,270 B2 | 7/2007 | Mansell et al. |
| 7,274,611 B2 | 9/2007 | Roohparvar |
| 7,284,106 B1 | 10/2007 | Fernald |
| 7,313,019 B2 | 12/2007 | Giduturi et al. |
| 7,329,136 B2 | 2/2008 | Su et al. |
| 7,334,072 B1 | 2/2008 | Wright |
| 7,356,676 B2 | 4/2008 | Paver et al. |
| 7,359,997 B2 | 4/2008 | Ishida et al. |
| 7,411,830 B2 | 8/2008 | Takeuchi et al. |
| 7,447,824 B2 | 11/2008 | Jabori et al. |
| 7,451,280 B2 | 11/2008 | Furtek et al. |
| 7,463,528 B2 | 12/2008 | Mokhlesi et al. |
| 7,467,253 B2 | 12/2008 | Yero |
| 7,469,311 B1 | 12/2008 | Tsu et al. |
| 7,478,188 B2 | 1/2009 | Patton |
| 7,480,757 B2 | 1/2009 | Atherton et al. |
| 7,480,808 B2 | 1/2009 | Caruk et al. |
| 7,496,707 B2 | 2/2009 | Freking et al. |
| 7,499,343 B2 | 3/2009 | Kang |
| 7,536,490 B2 | 5/2009 | Mao |
| 7,539,809 B2 | 5/2009 | Juenger |
| 7,542,350 B2 | 6/2009 | Park et al. |
| 7,571,287 B2 | 8/2009 | Lee et al. |
| 7,583,600 B1 | 9/2009 | Schanke et al. |
| 7,599,221 B2 | 10/2009 | Yamada |
| 7,606,960 B2 | 10/2009 | Munguia |
| 7,613,045 B2 | 11/2009 | Murin et al. |
| 7,613,871 B2 | 11/2009 | Tanaka et al. |
| 7,624,221 B1 | 11/2009 | Case |
| 7,649,539 B2 | 1/2010 | Evans et al. |
| 7,660,925 B2 | 2/2010 | Larson et al. |
| 7,685,322 B2 | 3/2010 | Bhesania et al. |
| 7,689,753 B2 | 3/2010 | Kwak et al. |
| 7,734,874 B2 | 6/2010 | Zhang et al. |
| 7,752,342 B2 | 7/2010 | Tee et al. |
| 7,783,845 B2 * | 8/2010 | Bennett et al. ............... 711/159 |
| 7,822,955 B2 | 10/2010 | Flynn et al. |
| 7,903,462 B2 | 3/2011 | Yeung et al. |
| 7,941,590 B2 | 5/2011 | Yang et al. |
| 7,945,825 B2 | 5/2011 | Cohen et al. |
| 7,949,817 B1 | 5/2011 | Sakarda |
| 8,127,104 B1 | 2/2012 | Shen |
| 8,131,915 B1 * | 3/2012 | Yang ............................ 711/103 |
| 8,154,919 B2 | 4/2012 | Lee et al. |
| 8,205,028 B1 | 6/2012 | Sakarda |
| 8,213,228 B1 | 7/2012 | Yang |
| 8,213,236 B1 | 7/2012 | Wu |
| 8,234,425 B1 | 7/2012 | Milner |
| 8,335,878 B2 | 12/2012 | Lee |
| 8,423,710 B1 | 4/2013 | Gole |
| 8,533,386 B1 * | 9/2013 | Yang ............................ 711/103 |
| 8,688,922 B1 | 4/2014 | Assmann |
| 8,688,947 B1 | 4/2014 | Kona et al. |
| 8,756,394 B1 | 6/2014 | Warner |
| 8,843,723 B1 | 9/2014 | Warner |
| 8,874,833 B1 | 10/2014 | Gole |
| 2001/0003198 A1 | 6/2001 | Wu |
| 2001/0036116 A1 | 11/2001 | Kubo et al. |
| 2002/0116584 A1 | 8/2002 | Wilkerson |
| 2003/0154314 A1 | 8/2003 | Mason, Jr. et al. |
| 2004/0024941 A1 | 2/2004 | Olarig et al. |
| 2004/0027901 A1 | 2/2004 | Shiga et al. |
| 2004/0093389 A1 | 5/2004 | Mohamed et al. |
| 2004/0098556 A1 | 5/2004 | Buxton et al. |
| 2004/0193774 A1 | 9/2004 | Iwata et al. |
| 2004/0199734 A1 | 10/2004 | Rajamani et al. |
| 2004/0202192 A9 | 10/2004 | Galbi et al. |
| 2005/0008011 A1 | 1/2005 | Georgiou et al. |
| 2005/0268001 A1 | 12/2005 | Kimelman et al. |
| 2006/0010304 A1 | 1/2006 | Homewood et al. |
| 2006/0031628 A1 | 2/2006 | Sharma |
| 2006/0075144 A1 | 4/2006 | Challener et al. |
| 2006/0106962 A1 | 5/2006 | Woodbridge et al. |
| 2006/0268610 A1 * | 11/2006 | Ishii et al. ............... 365/185.12 |
| 2006/0288153 A1 | 12/2006 | Tanaka et al. |
| 2006/0288188 A1 | 12/2006 | Ma et al. |
| 2007/0002880 A1 | 1/2007 | Chien et al. |
| 2007/0176939 A1 | 8/2007 | Sadowski |
| 2007/0229503 A1 | 10/2007 | Witzel et al. |
| 2007/0271609 A1 | 11/2007 | Chen et al. |
| 2007/0283086 A1 | 12/2007 | Bates |
| 2008/0094897 A1 | 4/2008 | Chung et al. |
| 2008/0126728 A1 | 5/2008 | Fernald |
| 2008/0147978 A1 | 6/2008 | Pesavento et al. |
| 2008/0148083 A1 | 6/2008 | Pesavento et al. |
| 2008/0175055 A1 | 7/2008 | Kim |
| 2008/0195801 A1 | 8/2008 | Cheon et al. |
| 2008/0215773 A1 | 9/2008 | Christison et al. |
| 2008/0215774 A1 | 9/2008 | Kim et al. |
| 2008/0256282 A1 | 10/2008 | Guo et al. |
| 2008/0265838 A1 | 10/2008 | Garg et al. |
| 2008/0270679 A1 | 10/2008 | Joo |
| 2008/0294951 A1 | 11/2008 | Ahmad et al. |
| 2008/0320189 A1 | 12/2008 | Arssov |
| 2009/0067511 A1 | 3/2009 | Wei et al. |
| 2009/0113166 A1 | 4/2009 | Houston et al. |
| 2009/0122610 A1 | 5/2009 | Danon et al. |
| 2009/0132770 A1 | 5/2009 | Lin |
| 2009/0150599 A1 | 6/2009 | Bennett |
| 2009/0154000 A1 | 6/2009 | Kojima |
| 2009/0200982 A1 | 8/2009 | Hurtz |
| 2009/0207658 A1 * | 8/2009 | Kuo et al. ............... 365/185.03 |
| 2009/0228739 A1 | 9/2009 | Cohen et al. |
| 2009/0273975 A1 | 11/2009 | Sarin et al. |

(56) References Cited

U.S. PATENT DOCUMENTS

2009/0300260 A1 12/2009 Woo et al.
2010/0027350 A1 2/2010 Melik-Martirosian et al.

FOREIGN PATENT DOCUMENTS

| JP | 4061094 | 2/1992 |
|----|---------|--------|
| JP | 5047174 | 2/1993 |
| JP | 10506776 | 6/1998 |
| JP | 2004288355 | 10/2004 |
| JP | 5107204 | 10/2012 |

OTHER PUBLICATIONS

"Non-Final Office Action", U.S. Appl. No. 14/199,307, Apr. 10, 2014, 5 pages.
"6-Port Fast Ethernet Switch, 88E6060 (Product Overview)", Link Street; www.marvell.com; Marvell Semiconductor, Inc.; Sunnyvale, CA, 2002, 2 pgs.
"7-Port Fast Ethernet Switch with 802.1 Q, 88E6063 (Product Overview)", www.marvell.com; Marvell Semiconductor, Inc.; Sunnyvale, CA, 2002, 2 pgs.
"Advisory Action", U.S. Appl. No. 12/163,801, Jan. 24, 2011, 2 pages.
"Advisory Action", U.S. Appl. No. 10/702,744, Sep. 11, 2007, 3 pages.
"Coprocessor", Retrieved from <http://en.wikipedia.org/wiki/Coprocessor>, Nov. 2006, 1 page.
"Corrected Notice of Allowance", U.S. Appl. No. 13/268,183, Nov. 19, 2013, 2 pages.
"European Communication and Search Report", Application No. EP04006012; European Patent Office; Munich, Germany, May 30, 2005, 4 pgs.
"European Search Report", Application No. EP04006012; Munich, Germany, May 30, 2005, 4 pages.
"Final Office Action", U.S. Appl. No. 12/163,801, Oct. 14, 2010, 12 pages.
"Final Office Action", U.S. Appl. No. 12/163,801, Nov. 14, 2011, 12 pages.
"Final Office Action", U.S. Appl. No. 12/494,076, Mar. 30, 2011, 13 pages.
"Final Office Action", U.S. Appl. No. 10/702,744, Jun. 25, 2007, 13 pages.
"Final Office Action", U.S. Appl. No. 12/494,076, Oct. 3, 2011, 13 pages.
"Final Office Action", U.S. Appl. No. 12/276,084, Oct. 17, 2011, 15 pages.
"Final Office Action", U.S. Appl. No. 12/434,000, Apr. 26, 2011, 15 pages.
"Final Office Action", U.S. Appl. No. 12/182,014, Oct. 29, 2010, 16 pages.
"Final Office Action", U.S. Appl. No. 12/332,870, Oct. 12, 2011, 17 pages.
"Final Office Action", U.S. Appl. No. 12/434,000, Sep. 4, 2012, 17 pages.
"Final Office Action", U.S. Appl. No. 12/332,870, Sep. 10, 2013, 20 pages.
"Final Office Action", U.S. Appl. No. 13/092,734, Dec. 29, 2011, 6 pages.
"Foreign Notice of Allowance", Japanese Application No. 2008-270813, Aug. 31, 2012, 7 pages.
"Foreign Office Action", Japanese Application No. 2004-071574, Feb. 19, 2008, 4 pages.
"Foreign Office Action", Japanese Application No. 2008-270813, May 26, 2011, 4 pages.
"Foreign Office Action", Japanese Application No. 2008-270813, Apr. 3, 2012, 6 pages.
Prince "High Performance Memories, New Architectures DRAMs and SRAMs—Evolution and Function", John Wiley & Sons, Ltd.; West Sussex, England, 1996, pp. 58-61.

"Information Technology—Telecommunications and Information Exchange Between Systems—Local and Metropolitan Area Networks—Specfic Requirements", IEEE,Wireless LAN Medium Access Control (MAC) and Physical Layer (PHY) Specifications, Aug. 20, 1999, 531 pages.
Pallampati "iSCSI Performance Over RDMA-Enabled Network", Thesis, Department of Electrical and Computer Engineering, Graduate School of Wichita State University, Jul. 2006, 58 pages.
"Link Street 88E6063 7-Port Fast Ethernet Switch with QoS, 802.1Q VLAN, and Virtual Cable Tester (VCT) Technology", Marvell: News; www.marvell.com; Marvell Semiconductor, Inc.; Sunnyvale, CA, Jul. 14, 2003, 1 page.
"Link Street 88E6181 8-Port Gigabit Ethernet Switch with Four-Level QoS", Marvell: News; www.marvell.com; Marvell Semiconductor, Inc.; Sunnyvale, CA, Jul. 14, 2003, 1 page.
"Link Street, Integrated Gateway Router with Multi-Port QoS Switch 88E6218 (Product Overview)", Gateway Solutions; www.marvell.com; Marvell Semiconductor, Inc.; Sunnyvale, CA, 2003, 2 pgs.
"Link Street, Integrated Gateway Router with Multi-Port Switch, 88E6208 (Product Overview)", Gateway Solutions; www.marvell.com; Marvell Semiconductor, Inc.; Sunnyvale, CA, 2003, 2 pgs.
"Marvell Link Street Gigabit Ethernet Switches Enable the Rapid Deployment of Gigabit Connectivity for the SOHO Market", Marvell: Press and Investor News; Marvell Semiconductor, Inc.; Sunnyvale, CA; http://www.marvell.com/press/pressNewsDisplay.do?releaseID=347, Apr. 29, 2003, 2 pgs.
"Method and Circuit for Transferring Data with Dynamic Parity Generation and Checking Scheme in Multi-port DRAM", esp@cenet; Publication No. JP10506776T (Abstract of Corresponding Document No. US5778007); esp@cenet Database—Worldwide; http://v3.espacenet.com/textdoc?DB=EPODOC&IDX=JP10506776T&F=0, Jun. 30, 1998, 5 pages.
"Multiport Component Memory Series and Application with a Computer", Automated Translation; Europaisches Patentamt, European Patent Office, Office European Des Brevets; Description of FR2779843; World Lingo Language Translation Services; www.worldlingo.com, Nov. 19, 2007, 15 pgs.
Mori "Multiport Memory", English Abstract of Japanese Patent Publication No. JP5047174; esp@cenet database—Worldwide, Feb. 26, 1993, 1 page.
"Network Attached Storage (NAS) Advantages", Retrieved from: <http://www.html.co.uk/86/network-attached-storage-nas-advantages.htm l> on Oct. 7, 2013, Aug. 22, 2008, 4 pages.
"Non-Final Office Action", U.S. Appl. No. 10/702,744, 12/27/06, 10 pages.
"Non-Final Office Action", U.S. Appl. No. 12/163,801, Apr. 22, 2010, 10 pages.
"Non-Final Office Action", U.S. Appl. No. 12/163,801, Jul. 20, 2011, 11 pages.
"Non-Final Office Action", U.S. Appl. No. 12/726,310, Aug. 1, 2012, 11 pages.
"Non-Final Office Action", U.S. Appl. No. 13/045,186, Aug. 22, 2013, 12 pages.
"Non-Final Office Action", U.S. Appl. No. 12/494,076, Dec. 22, 2010, 12 pages.
"Non-Final Office Action", U.S. Appl. No. 12/276,084, Apr. 11, 2011, 12 pages.
"Non-Final Office Action", U.S. Appl. 12/182,014, Jun. 1, 2010, 13 pages.
"Non-Final Office Action", U.S. Appl. No. 13/860,394, Oct. 2, 2013, 13 pages.
"Non-Final Office Action", U.S. Appl. No. 12/332,870, Apr. 25, 2011, 15 pages.
"Non-Final Office Action", U.S. Appl. No. 12/434,000, May 4, 2012, 15 pages.
"Non-Final Office Action", U.S. Appl. No. 13/092,734, Aug. 24, 2011, 15 pages.
"Non-Final Office Action", U.S. Appl. No. 12/434,000, Mar. 14, 2013, 18 pages.
"Non-Final Office Action", U.S. Appl. No. 12/332,870, May 8, 2013, 19 pages.
"Non-Final Office Action", U.S. Appl. No. 13/406,756, Nov. 5, 2012, 4 pages.

(56) References Cited

OTHER PUBLICATIONS

"Non-Final Office Action", U.S. Appl. No. 10/702,744, Feb. 19, 2009, 5 pages.
"Non-Final Office Action", U.S. Appl. No. 13/538,827, May 2, 2013, 6 pages.
"Non-Final Office Action", U.S. Appl. No. 13/268,183, May 7, 2013, 6 pages.
"Non-Final Office Action", U.S. Appl. No. 12/396,250, Jun. 23, 2011, 6 pages.
"Non-Final Office Action", U.S. Appl. No. 12/436,577, Sep. 29, 2010, 6 pages.
"Non-Final Office Action", U.S. Appl. No. 13/538,827, Feb. 22, 2013, 7 pages.
"Non-Final Office Action", U.S. Appl. No. 12/276,084, Mar. 29, 2013, 7 pages.
"Non-Final Office Action", U.S. Appl. No. 13/177,965, Jul. 2, 2013, 7 pages.
"Non-Final Office Action", U.S. Appl. No. 12/180,238, Apr. 12, 2011, 7 pages.
"Non-Final Office Action", U.S. Appl. No. 12/862,600, Oct. 16, 2013, 8 pages.
"Non-Final Office Action", U.S. Appl. No. 12/434,000, Nov. 10, 2010, 9 pages.
"Notice of Allowance", U.S. Appl. No. 12/610,106, Feb. 29, 2012, 11 pages.
"Notice of Allowance", U.S. Appl. No. 13/716,481, Nov. 14, 2013, 13 pages.
"Notice of Allowance", U.S. Appl. No. 12/396,250, Nov. 16, 2011, 4 pages.
"Notice of Allowance", U.S. Appl. No. 13/092,734, Feb. 23, 2012, 4 pages.
"Notice of Allowance", U.S. Appl. No. 12/436,577, Apr. 14, 2011, 4 pages.
"Notice of Allowance", U.S. Appl. No. 13/268,183, Jul. 29, 2013, 5 pages.
"Notice of Allowance", U.S. Appl. No. 12/276,084, Oct. 29, 2013, 5 pages.
"Notice of Allowance", U.S. Appl. No. 13/177,965, Nov. 20, 2013, 5 pages.
"Notice of Allowance", U.S. Appl. No. 12/182,014, Jan. 20, 2011, 6 pages.
"Notice of Allowance", U.S. Appl. No. 12/180.238, Oct. 25, 2011, 6 pages.
"Notice of Allowance", U.S. Appl. No. 12/726,310, Dec. 18, 2012, 6 pages.
"Notice of Allowance", U.S. Appl. No. 12/762,150, Mar. 19, 2012, 6 pages.
"Notice of Allowance", U.S. Appl. No. 12/163,801, Mar. 22, 2012, 6 pages.
"Notice of Allowance", U.S. Appl. No. 10/702,744, Mar. 27, 2009, 7 pages.
"Notice of Allowance", U.S. Appl. No. 13/538,827, Sep. 17, 2013, 7 pages.
"Notice of Allowance", U.S. Appl. No. 13/406,756, May 8, 2013, 7 pages.
"Notice of Allowance", U.S. Appl. No. 12/494,076, Aug. 2, 2012, 8 pages.
"Notice of Allowance", U.S. Appl. No. 12/434,000, Oct. 17, 2013, 9 pages.
"Notice of Allowance", U.S. Appl. No. 13/045,186, Nov. 1, 2013, 9 pages.
"Partial European Search Report", Application No. EP04006012; European Patent Office, Munich, Germany, Mar. 14, 2005, 2 pgs.
"Restriction Requirement", U.S. Appl. No. 13/045,186, Jun. 19, 2013, 5 pages.
"Restriction Requirement", U.S. Appl. No. 10/702,744, Jun. 30, 2006, 5 pages.
"Restriction Requirement", U.S. Appl. No. 12/610,106, Dec. 7, 2011, 5 pages.
"Restriction Requirement", U.S. Appl. No. 12/862,600, May 24, 2013, 7 pages.
Litaize et al.,"Serial Multi Port Memory Component Comprising RAM Memory Bank Assemblies for Use in Computer", Abstract of FR2779843; Publication No. FR2779843; esp@cenet database; http://v3.espace.com/textdoc?DB=EPODOC&IDX=FR2779843 &F=0, Dec. 12, 1999, 1 page.
"U.S. Appl. No. 12/726,310", filed Mar. 17, 2010, 36 pages.
"U.S. Appl. No. 12/862,600", filed Aug. 24, 2010, 36 pages.
"Final Office Action", U.S. Appl. No. 12/332,870, Jun. 26, 2014, 20 pages.
"Final Office Action", U.S. Appl. No. 13/860,394, May 2, 2014, 7 pages.
"Notice of Allowance", U.S. Appl. No. 13/860,394, May 28, 2014, 6 pages.
"Notice of Allowance", U.S. Appl. No. 14/199,307, May 7, 2014, 7 pages.
"Corrected Notice of Allowance", U.S. Appl. No. 13/860,394, Sep. 29, 2014, 2 pages.
"Non-Final Office Action", U.S. Appl. No. 12/332,870, Nov. 6, 2014, 18 pages.
"Final Office Action", U.S. Appl. No. 12/332,870, Apr. 14, 2015, 18 pages.
"Non-Final Office Action", U.S. Appl. No. 14/484,117, Mar. 25, 2015, 7 pages.

* cited by examiner

MODIFYING DATA STORED IN A MULTIPLE-WRITE FLASH MEMORY CELL

CROSS-REFERENCE TO RELATED APPLICATIONS

This present disclosure is a continuation of U.S. application Ser. No. 13/408,756, filed on Feb. 28, 2012, which is a continuation of U.S. application Ser. No. 12/396,250, now U.S. Pat. No. 8,131,915, filed on Mar. 2, 2009, which claims priority to U.S. Provisional Patent Application Ser. No. 61/044,251, filed on Apr. 11, 2008, the entire disclosure of which are incorporated by reference herein in their entirety.

BACKGROUND

A computer device typically initiates frequent updates to data and/or data objects that are stored in memory of the device. Frequent data updates may include updates and modifications to database information, or updates to a file allocation table (FAT) for a computer device. A conventional storage device and/or memory that is implemented as flash memory does not modify or update data over existing data that is stored in the flash memory. For example, the data stored in a flash memory cell is not written over or modified, but rather is erased before additional data can be written to the flash memory cell. In addition, modified data is stored at a different memory location, and the memory location of the original data is subsequently marked as invalid. An additional process is then required to erase the invalid data.

Frequent data modification requests to a flash memory device comes with undesirable processing and overhead, such as the overhead to modify even one bit of database information. Typically, the entire database with the data modification is rewritten to free memory, the memory location of the previously stored database information is invalidated, and the memory location of the new database information is referenced for subsequent access. The previously stored database information that is invalidated is then erased. Frequent erase operations also utilize processing resources and consume power, and can cause wear on the flash memory device, thus reducing the reliability and longevity of the device that has a finite number of write-erase cycles.

SUMMARY

This summary introduces concepts of flash memory stored data modification, and the concepts are further described below in the Detailed Description. Accordingly, the summary should not be considered to identify essential features nor used to limit the scope of the claimed subject matter.

In embodiments of flash memory stored data modification, a flash memory system includes flash memory and a memory controller that manages data write and erase operations to the flash memory. The flash memory includes a first flash memory region of single-write flash memory cells that are each configured for a data write operation and a corresponding erase operation before a subsequent data write operation. The flash memory also includes a second flash memory region of multiple-write flash memory cells that are each configured for multiple data write operations before an erase operation.

In other embodiments, a method is implemented for providing a flash memory having a first flash memory region and a second flash memory region. The method is also implemented for writing first data to the first flash memory region of single-write flash memory cells each configured for a data write operation and a corresponding erase operation before a subsequent data write operation. The method is also implemented for writing second data to the second flash memory region of multiple-write flash memory cells each configured for multiple data write operations before an erase operation.

In other embodiments, a system-on-chip (SoC) includes a memory controller and a flash memory having a first flash memory region and a second flash memory region. The memory controller can write first data to the first flash memory of single-write flash memory cells each configured for a data write operation and a corresponding erase operation before a subsequent data write operation. The memory controller can also write second data to the second flash memory region of multiple-write flash memory cells each configured for multiple data write operations before an erase operation.

BRIEF DESCRIPTION OF THE DRAWINGS

Embodiments of flash memory stored data modification are described with reference to the following drawings. The same numbers are used throughout the drawings to reference like features and components.

DETAILED DESCRIPTION

Embodiments of flash memory stored data modification provide that data stored in flash memory cells can be modified or updated. A flash memory device includes a first memory region for increased storage capacity with single-write flash memory cells. The flash memory device also includes a second memory region of multiple-write flash memory cells that are implemented for data updates to current data that is stored in the memory cells. A flash memory device implemented for flash memory stored data modification also provides improved system performance, power savings, and minimizes processing resources because data stored in flash memory cells can be modified, rather than having to write updated data to free memory, invalidate and erase the previous data, and reference or link to the updated data.

While features and concepts of the described systems and methods for flash memory stored data modification can be implemented in any number of different environments, systems, networks, and/or various configurations, embodiments of flash memory stored data modification are described in the context of the following example networks and environments.

Figure 1:
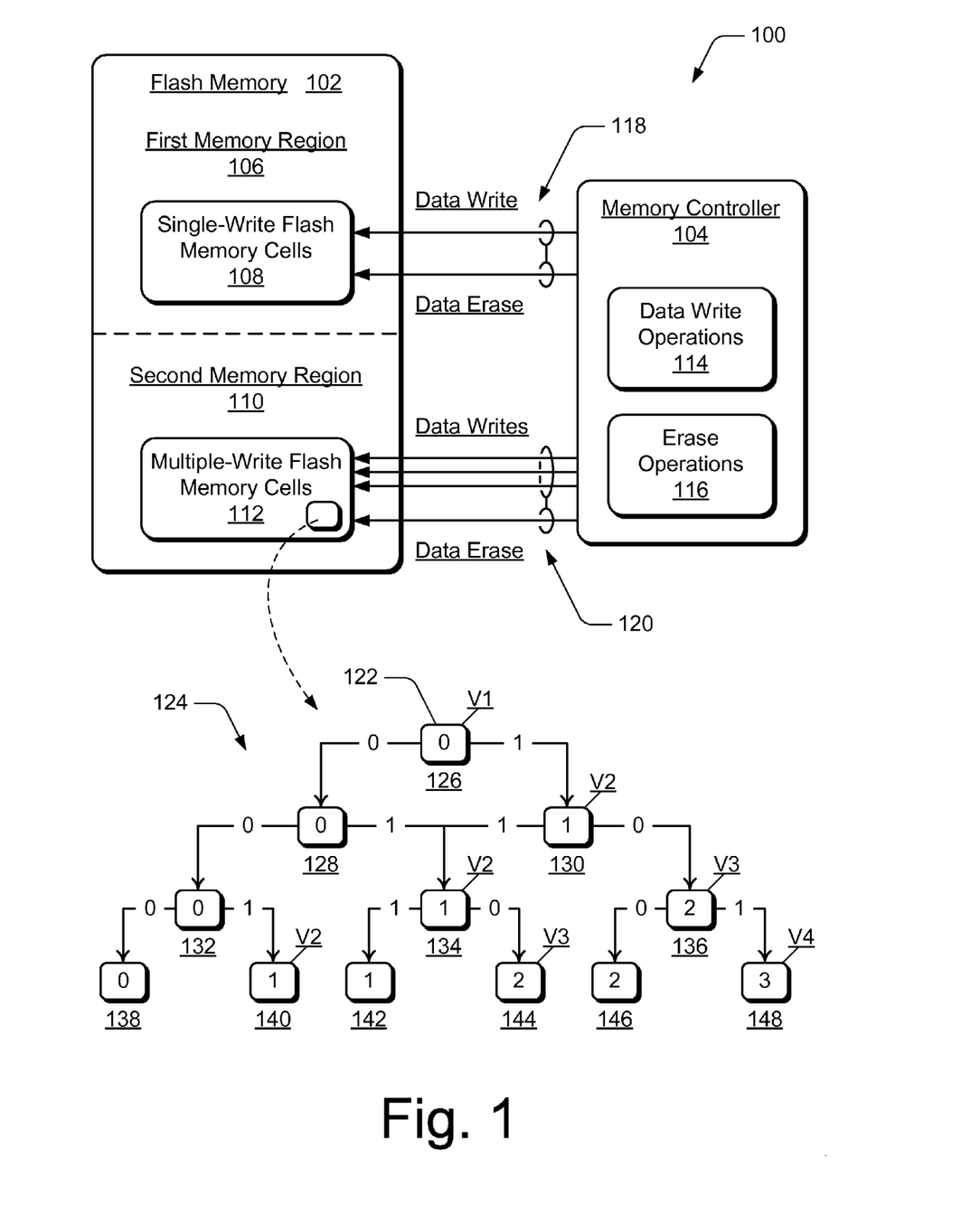
FIG. 1 illustrates an example flash memory system in which embodiments of flash memory stored data modification can be implemented.

FIG. 1 illustrates an example flash memory system 100 in which embodiments of flash memory stored data modification can be implemented. In an embodiment, flash memory system 100 includes a flash memory 102 and a memory controller 104. In this example, flash memory 102 includes a first flash memory region 106 of single-write flash memory cells 108, and a second flash memory region 110 of multiple-write flash memory cells 112. Although the flash memory 102 is shown with only two memory regions in this example, a flash memory can include any number of memory regions in various embodiments of flash memory stored data modification. In an implementation, the term single-write indicates that a page in the first flash memory region 106 can be programmed only once after a block erase operation, and the term multiple-write indicates that a page in the second flash memory region 110 can be programmed more than one time after a block erase operation.

The memory controller 104 in the flash memory system 100 can be implemented as computer-executable instructions and executed by processors to implement various embodiments and/or features of flash memory stored data modification. The memory controller 104 manages data write operations 114 to flash memory 102, and erase operations 116 to erase the single-write flash memory cells 108 and/or the multiple-write flash memory cells 112. In embodiments, the memory controller 104 manages a data write operation and a corresponding erase operation for a single-write flash memory cell at 118. The memory controller 104 can also manage multiple data write operations before an erase operation for a multiple-write flash memory cell at 120.

The memory controller 104 manages data write operations 114 to the first flash memory region 106 to store data that is expected to be modified less frequently than data that is stored in the second flash memory region 110. Conversely, the memory controller 104 can also manage data write operations 114 to the second flash memory region 110 to store data that is expected to be modified more frequently than data that is stored in the first flash memory region 106. For example, the memory controller 104 can determine that video or image data is not likely to be modified, and manage writing the video or image data to the single-write flash memory cells 108 of the first flash memory region 106. The memory controller 104 can also determine that records in a database are likely to be frequently modified, and manage writing the data for the database records to the multiple-write flash memory cells 112 of the second flash memory region 110. The frequency of modification can be determined based on statistics, historical information, and/or other design parameters.

In embodiments, the memory controller 104 can allocate the multiple-write flash memory cells 112 of the second flash memory region 110 from flash memory cells of the first flash memory region 106. The second flash memory region 110 can be dynamically allocated as needed, or as determined by the memory controller 104. Alternatively, the second flash memory region 110 can be implemented as a fixed memory region of the flash memory 102. Alternatively, the entire flash memory 102 can be implemented or allocated as multiple-write flash memory cells 112 for flash memory stored data modification according to various embodiments, implementations, and application utilization.

The single-write flash memory cells 108 of the first flash memory region 106 can each be implemented as any type of a flash memory cell to store data. The single-write flash memory cells 108 can each be implemented for a data write operation and a corresponding erase operation at 118 before a subsequent data write operation. The first flash memory region 106 stores data in a mode intended to maximize the storage capacity of flash memory 102. Flash memory 102 can be implemented as any type of non-volatile memory that is programmed, erased, and reprogrammed, such as for use in memory cards and USB flash drives utilized to store and/or transfer data between devices.

In an implementation, flash memory 102 stores data in an array of floating-gate transistors that can be single-level memory cell and/or multi-level memory cell devices. A multi-level, floating-gate transistor in the first flash memory region 106 can store more than one data bit per cell based on a varied electrical charge stored at the floating gate of the transistor. In a multi-level cell device that can store more than one data bit per cell, the amount of current flow can be sensed to determine the level of charge on the floating gate. For example, a four-level flash memory cell is implemented to store two data bits based on four corresponding threshold voltage levels, such as a threshold voltage level V1 to encode a 0,0 data value, a threshold voltage level V2 to encode a 0,1 data value, a threshold voltage level V3 to encode a 1,0 data value, and a threshold voltage level V4 to encode a 1,1 data value.

The multiple-write flash memory cells 112 of the second flash memory region 110 can each be implemented for multiple data write operations before an erase operation at 120 to provide for flash memory stored data modification. The multiple-write flash memory cells 112 are multi-level memory cells that store different data bits one at a time based on a varied electrical charge when utilized for flash memory stored data modification. In embodiments, the multiple-write flash memory cells 112 can be allocated from the first flash memory region 106 and can each be implemented as a multi-level, floating-gate transistor.

The programming of a memory cell 122 in accordance with embodiments for flash memory stored data modification is shown in an example 124. Memory cell 122 is implemented as a four-level, floating-gate transistor and is only one example of the many multiple-write flash memory cells 112 in the second flash memory region 110 of flash memory 102. The example 124 illustrates a four-level flash memory cell that is implemented for three data write operations before a single erase operation, and each data write operation accommodates writing one data bit.

Initially, memory cell 122 is a logical data bit zero at 126 that also corresponds to a threshold voltage level V1 of the transistor that corresponds to state-0 of the memory cell. When a first data write operation is initiated by memory controller 104 to the memory cell 122, the data bit stored in the memory cell remains unchanged at 128 for a data write operation of zero (e.g., the 0 data bit transition from the memory cell at 126 to 128). Alternatively, the current data bit stored in the memory cell is programmed as a logical data bit one at 130 for a data write operation of one (e.g., the 1 data bit transition from the memory cell at 126 to 130). Programming the memory cell as the logical data bit one at 130 corresponds to an increased threshold voltage level V2 of the transistor that corresponds to state-1 of the memory cell.

The data modify process can then be repeated for a second data write operation and a third data write operation in this example of a four-level flash memory cell 122. For a subsequent data write operation of a data bit that is the same as the data bit that is already stored in the memory cell, the stored data remains unchanged. For a subsequent data write operation of a data bit that overwrites or modifies the data bit that is already stored in the memory cell, the voltage level at the transistor is increased to represent the modified data value. The voltage level at the transistor can be increased each time that the data value stored in the memory cell is modified. This utilizes the design of the transistor to increase the threshold voltage from V1, to V2, to V3, to V4, and then erase. In this data modify process, the data value of memory cell 122 can be changed three times without having to initiate an erase operation, and at any time, the current data value that is stored in the memory cell can be read out.

Continuing the example 124, when a second data write operation is initiated by memory controller 104 to the memory cell at 128 (because the first data write operation was a 0 data bit), the data bit stored in the memory cell remains unchanged at 132 for a data write operation of zero (e.g., the 0 data bit transition from the memory cell at 128 to 132). Alternatively, the current data bit stored in the memory cell at 128 is programmed as a logical data bit one at 134 for a data write operation of one (e.g., the 1 data bit transition from the memory cell at 128 to 134). Programming the memory cell as the logical data bit one at 134 corresponds to an increased voltage level V2 of the transistor that corresponds to state-1 of the memory cell.

When a second data write operation is initiated by memory controller 104 to the memory cell at 130 (because the first data write operation was a 1 data bit), the data bit stored in the memory cell remains unchanged at 134 for a data write operation of one (e.g., the 1 data bit transition from the memory cell at 130 to 134). Alternatively, the current data bit stored in the memory cell at 130 is programmed as a logical data bit zero at 136 for a data write operation of zero (e.g., the 0 data bit transition from the memory cell at 130 to 136). Programming the memory cell as the logical data bit zero at 136 corresponds to an increased threshold voltage level V3 of the transistor that corresponds to state-2 of the memory cell.

Continuing the example 124, when a third data write operation is initiated by memory controller 104 to the memory cell at 132, the data bit stored in the memory cell remains unchanged at 138 for a data write operation of zero (e.g., the 0 data bit transition from the memory cell at 132 to 138). Alternatively, the current data bit stored in the memory cell at 132 is programmed as a logical data bit one at 140 for a data write operation of one (e.g., the 1 data bit transition from the memory cell at 132 to 140). Programming the memory cell as the logical data bit one at 140 corresponds to an increased voltage level V2 of the transistor that corresponds to state-1 of the memory cell.

When a third data write operation is initiated by memory controller 104 to the memory cell at 134, the data bit stored in the memory cell remains unchanged at 142 for a data write operation of one (e.g., the 1 data bit transition from the memory cell at 134 to 142). Alternatively, the current data bit stored in the memory cell at 134 is programmed as a logical data bit zero at 144 for a data write operation of zero (e.g., the 0 data bit transition from the memory cell at 134 to 144). Programming the memory cell as the logical data bit zero at 144 corresponds to an increased voltage level V3 of the transistor that corresponds to state-2 of the memory cell.

When a third data write operation is initiated by memory controller 104 to the memory cell at 136, the data bit stored in the memory cell remains unchanged at 146 for a data write operation of zero (e.g., the 0 data bit transition from the memory cell at 136 to 146). Alternatively, the current data bit stored in the memory cell at 136 is programmed as a logical data bit one at 148 for a data write operation of one (e.g., the 1 data bit transition from the memory cell at 136 to 148). Programming the memory cell as the logical data bit one at 148 corresponds to an increased voltage level V4 of the transistor that corresponds to state-3 of the memory cell.

It should be noted in example 124 that if the state of the memory cell 122 is zero or two, then the memory cell is programmed with a logical data bit zero, such as for the 0 data bit transitions from the memory cell at 126 to 128, from 128 to 132, from 132 to 138, from 130 to 136, from 134 to 144, and from 136 to 146. Alternatively, if the state of the memory cell is one or three, then the memory cell is programmed with a logical data bit one, such as for the 1 data bit transitions from the memory cell at 126 to 130, from 128 to 134, from 130 to 134, from 132 to 140, from 134 to 142, and from 136 to 148. If the state of the memory cell is even (e.g., state zero or two), then the logical data bit is a zero, and if the state of the memory cell is odd (e.g., state one or three), then the logical data bit is one.

The multiple-write flash memory cells 112 in the second flash memory region 110 of the flash memory 102 can be implemented as multi-level memory cell devices that include any number of L-levels. The number of data write operations 114 to a multi-level memory cell of L-levels is then L-1 data write operations before an erase operation 116 is executed. In the example 124, memory cell 122 is a four-level memory cell having four corresponding voltage levels, and the memory cell can be programmed three times before an erase operation is executed. In another example, an eight-level memory cell can be programmed according to data write operations 114 seven times before an erase operation is executed.

A trade-off for storing only one data bit at a time in a multi-level memory cell is decreased storage capacity in the second flash memory region 110 of flash memory 102, as compared to log 2(L) data bits that can be stored in multi-level, single-write flash memory cells of the first flash memory region 106. Embodiments of flash memory stored data modification, however, provide improved system performance, power savings, and minimize processing resources because data stored in memory cells of flash memory can be modified or updated, rather than having to write the updated data to free memory, invalidate and erase the previous data, and reference or link to the updated data. Embodiments also increase the lifetime and usability of a flash memory device that only has a finite number of write-erase cycles. Flash memory 102 provides a hybrid structure that includes increased storage capacity with the single-write flash memory cells 108 of the first flash memory region 106, and provides that data stored in the multiple-write flash memory cells 112 of the second flash memory region 110 can be frequently modified or updated.

Figure 2:
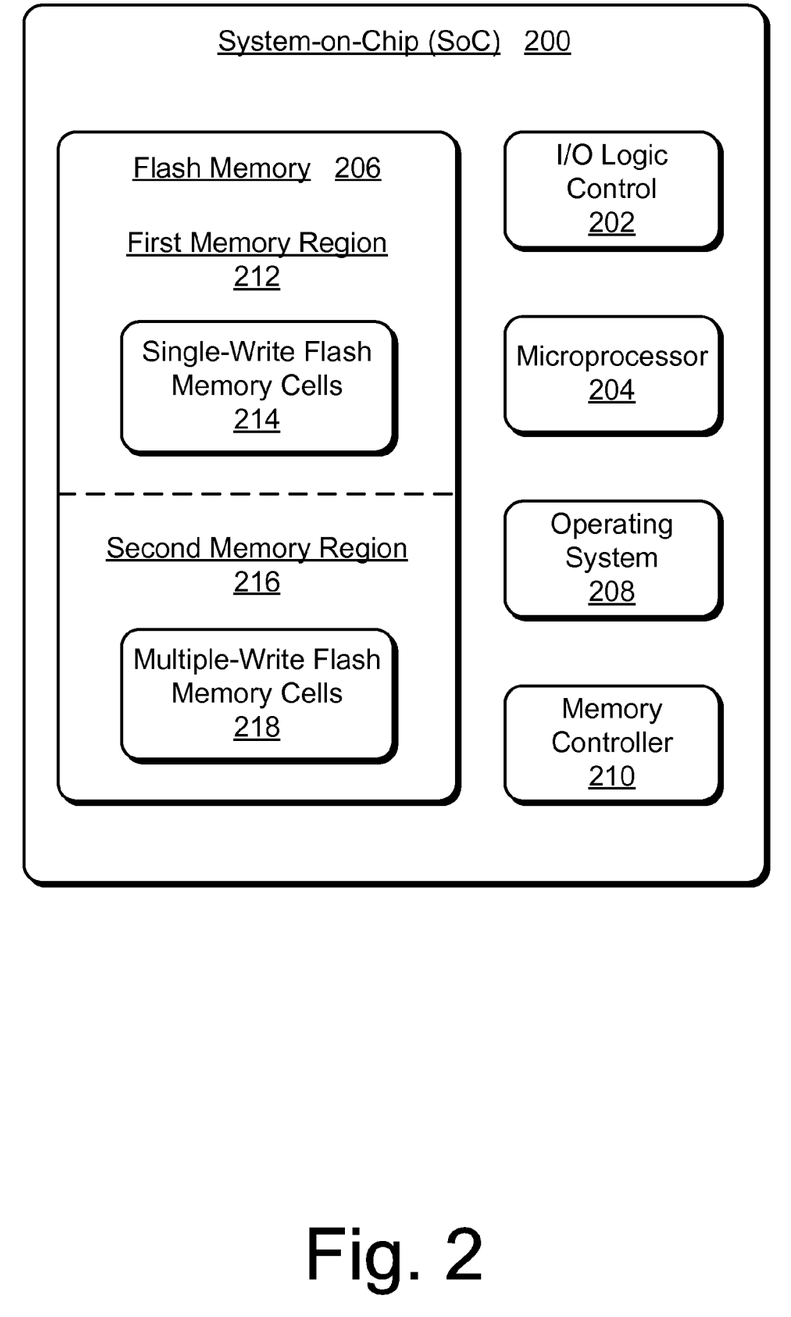
FIG. 2 illustrates an example system-on-chip (SoC) environment in which embodiments of flash memory stored data modification can be implemented.

FIG. 2 illustrates an example system-on-chip (SoC) 200 which can implement various embodiments of flash memory stored data modification in any type of a consumer electronic device. An SoC can be implemented in a fixed or mobile device, such as any one or combination of a media device, computer device, television set-top box, video processing and/or rendering device, appliance device, gaming device, electronic device, vehicle, workstation, and/or in any other type of device that may include flash memory.

The SoC 200 can be integrated with electronic circuitry, a microprocessor, memory, input-output (I/O) logic control, communication interfaces and components, other hardware, firmware, and/or software needed to run an entire device. The SoC 200 can also include an integrated data bus that couples the various components of the SoC for data communication between the components. A data bus in the SoC can be implemented as any one or a combination of different bus structures, such as a memory bus or memory controller, an advanced system bus, a peripheral bus, a universal serial bus, and/or a processor or local bus that utilizes any of a variety of bus architectures. In addition, a device that includes SoC 200 can also be implemented with any number and combination of differing components as further described with reference to the example device shown in FIG. 5.

In this example, SoC 200 includes various components such as an input-output (I/O) logic control 202 (e.g., to include electronic circuitry, generally) and a microprocessor 204 (e.g., any of a microcontroller, digital signal processor, etc.). The SoC 200 also includes flash memory 206 which can be any type of flash memory device, including NAND, NOR, NROM memory, and/or other suitable electronic data storage devices. The SoC 200 can also include various firmware and/or software, such as an operating system 208 and a memory controller 210 which can each be implemented as computer-executable instructions maintained by memory 206 and executed by microprocessor 204. The SoC 200 can also include other various communication interfaces and components, wireless LAN (WLAN) components, other hardware, firmware, and/or software.

The flash memory 206 and memory controller 210 together are an example of a flash memory system, such as flash memory system 100 described with reference to FIG. 1. The flash memory 206 includes a first flash memory region 212 of single-write flash memory cells 214, and includes a second flash memory region 216 of multiple-write flash memory cells 218. Examples of these various components, functions, and/or modules, and corresponding functionality and features, are described with reference to the respective components of the example flash memory system 100 shown in FIG. 1. Alternatively or in addition, the memory controller 210 can be implemented as hardware, firmware, fixed logic circuitry, or any combination thereof that is implemented in connection with the I/O logic control 202 and/or other signal processing and control circuits of SoC 200.

Example methods 300 and 400 are described with reference to respective FIGS. 3 and 4 in accordance with one or more embodiments of flash memory stored data modification. Generally, any of the functions, methods, procedures, components, and modules described herein can be implemented using hardware (e.g., fixed logic circuitry), software, firmware, manual processing, or any combination thereof. A software implementation of a function, method, procedure, component, or module represents program code that performs specified tasks when executed on a computing-based processor. The example methods may be described in the general context of computer-executable instructions, which can include software, applications, routines, programs, objects, components, data structures, procedures, modules, functions, and the like.

Figure 3:
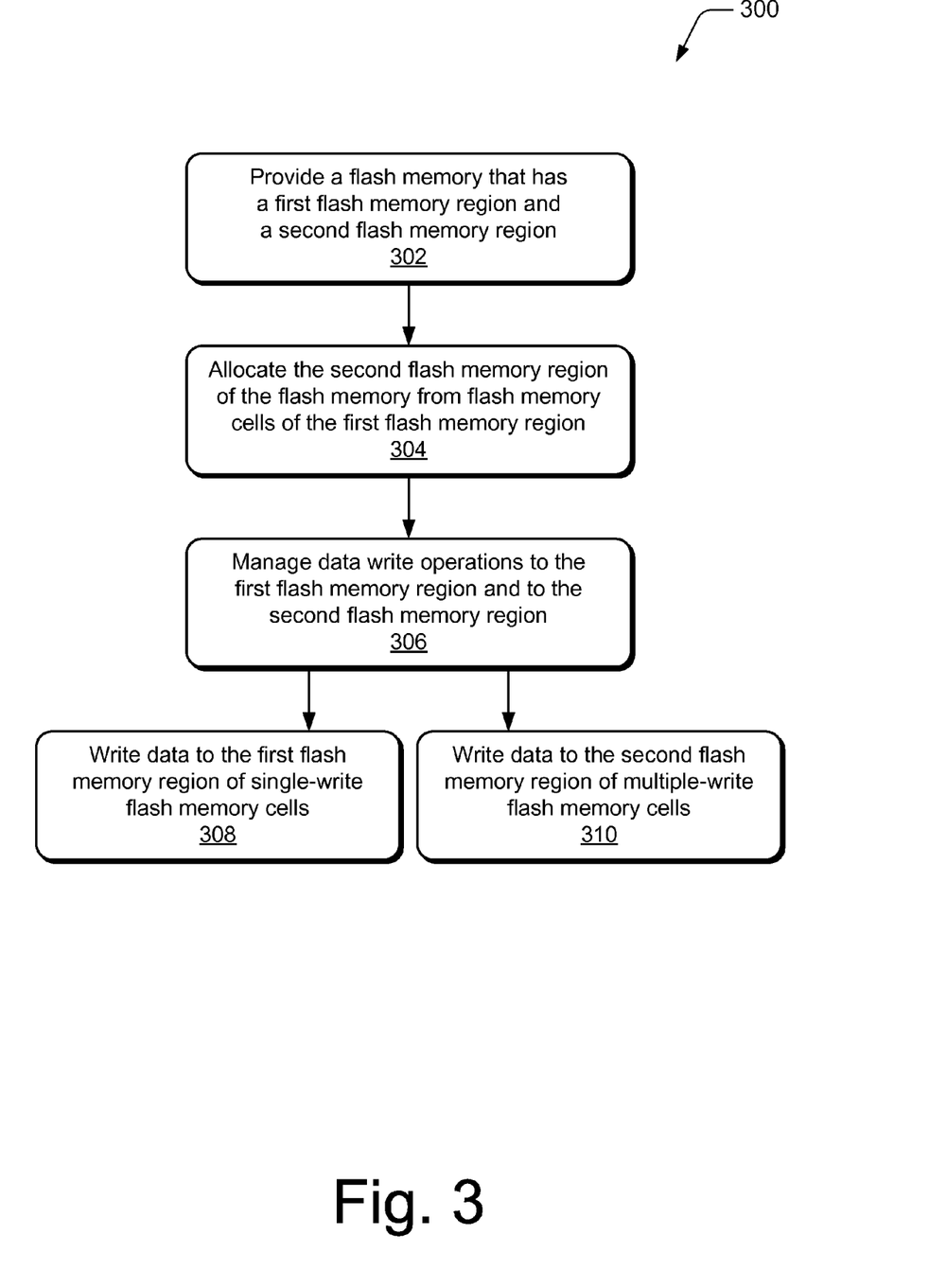
FIG. 3 illustrates an example method of flash memory stored data modification in accordance with one or more embodiments.

FIG. 3 illustrates example method(s) 300 of flash memory stored data modification. The order in which the method is described is not intended to be construed as a limitation, and any number of the described method blocks can be combined in any order to implement the method, or an alternate method.

At block 302, a flash memory is provided that has a first flash memory region and a second flash memory region. For example, flash memory 102 of the flash memory system 100 (FIG. 1) includes a first flash memory region 106 of single-write flash memory cells 108, and a second flash memory region 110 of multiple-write flash memory cells 112.

At block 304, the second flash memory region of the flash memory is allocated from flash memory cells of the first flash memory region. For example, the memory controller 104 allocates the multiple-write flash memory cells 112 of the second flash memory region 110 from the single-write flash memory cells 108 of the first flash memory region 106.

At block 306, data write operations to the first flash memory region and to the second flash memory region are managed. For example, the memory controller 104 of the flash memory system 100 manages data write operations 114 to the single-write flash memory cells 108 of the first flash memory region 106 to store data that is expected to be modified less frequently than data that is stored in the second flash memory region 110. The memory controller 104 also manages data write operations 114 to the multiple-write flash memory cells 112 of the second flash memory region 110 to store data that is expected to be modified more frequently than the data that is stored in the first flash memory region 106. In embodiments, the memory controller 104 can manage the data write operations to the first flash memory region (e.g., as described with reference to block 308) in parallel with data write operations to the second flash memory region (e.g., as described with reference to block 310).

At block 308, data is written to the first flash memory region of single-write flash memory cells that are each implemented for a data write operation and a corresponding erase operation before a subsequent data write operation. For example, the memory controller 104 of the flash memory system 100 writes data to the first flash memory region 106 of single-write flash memory cells 108 that are implemented for a data write operation and a corresponding erase operation at 118 before a subsequent data write operation.

At block 310, data is written to the second flash memory region of multiple-write flash memory cells that are each implemented for multiple data write operations before an erase operation. For example, the memory controller 104 of the flash memory system 100 writes data to the second flash memory region 110 of multiple-write flash memory cells 112 that are implemented for multiple data write operations before an erase operation at 120. In an embodiment, the data is written to a multiple-write flash memory cell 112 to modify or update stored data in the multiple-write flash memory cell. The multiple-write flash memory cells 112 can be implemented as multi-level cell devices that store different data bits one at a time, such as multi-level, floating-gate transistors that store more than one data bit per cell based on a varied electrical charge stored at a floating gate of the transistor.

Figure 4:
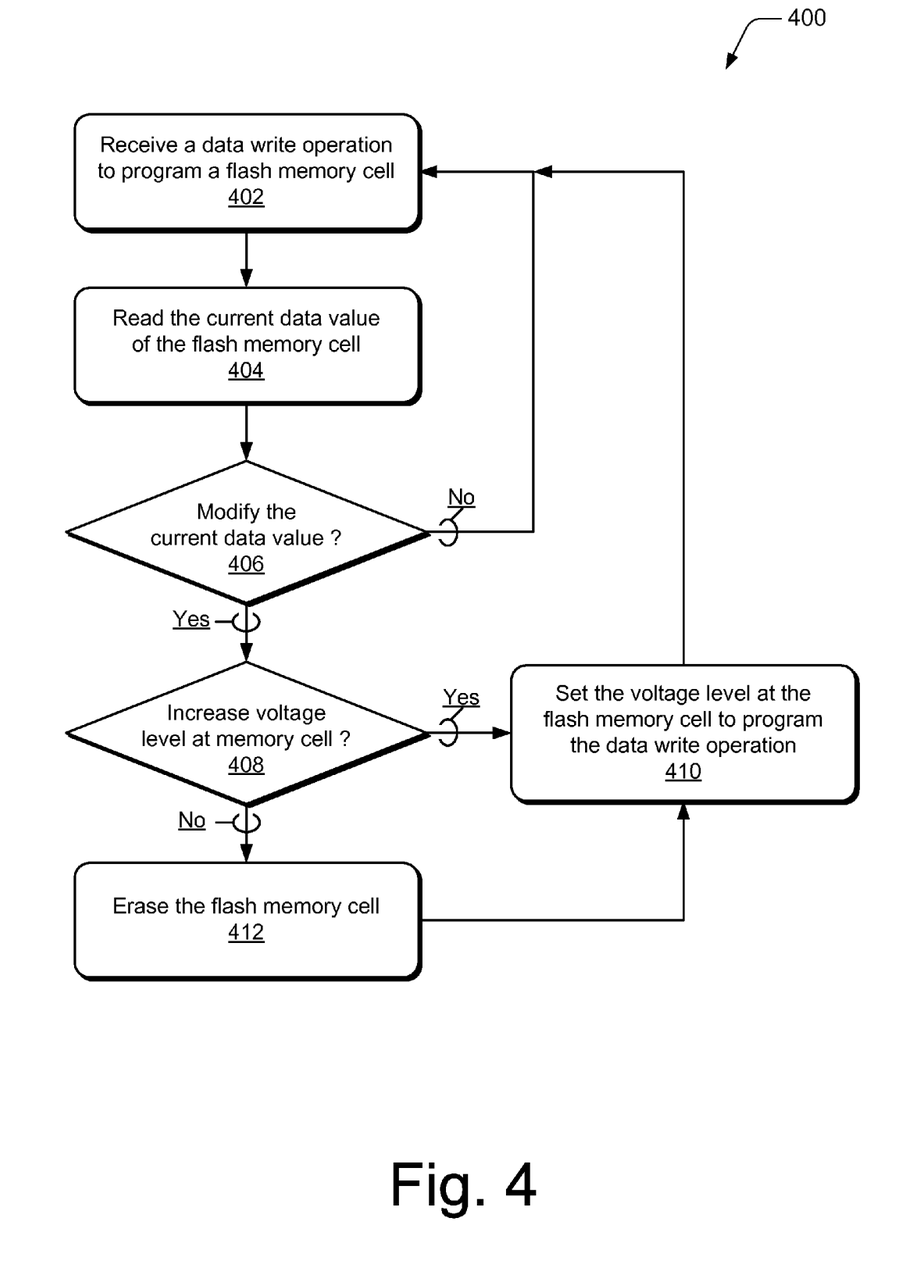
FIG. 4 illustrates an example method of flash memory stored data modification in accordance with one or more embodiments.

FIG. 4 illustrates example method(s) 400 of flash memory stored data modification. The order in which the method is described is not intended to be construed as a limitation, and any number of the described method blocks can be combined in any order to implement the method, or an alternate method.

At block 402, a data write operation is received to program a flash memory cell. For example, the memory controller 104 of the flash memory system 100 (FIG. 1) receives and/or initiates a data write operation 114 to program a multiple-write flash memory cell 112 in the second flash memory region 110 of the flash memory 102.

At block 404, the current data value of the flash memory cell is read. For example, the memory controller 104 reads the current data value of the flash memory cell, such as a data value of the multiple-write flash memory cell 122 shown in example 124. The memory controller 104 reads the data value of 1,0 that is state-2 which corresponds to the voltage level V3 at 136 for the flash memory cell 122. In example 124, voltage level V3 corresponds to a data bit zero stored in the flash memory cell at 136 (as noted by the previous 0 data bit transition from the memory cell at 130 to 136).

At block 406, a determination is made as to whether the current data value of the flash memory is to be modified. For example, the data value of flash memory cell 122 remains unchanged at 146 for a data write operation of zero (e.g., the 0 data bit transition from the memory cell at 136 to 146). If the current data value of the flash memory is not modified for a data write operation that equals the current data value of the flash memory (i.e., "no" from block 406), then the method continues at block 402 to receive a subsequent data write operation to program the flash memory cell when the data write operation is initiated.

If the current data value of the memory is to be modified according to the data write operation (i.e., "yes" from block 406), then at block 408, a determination is made as to whether a voltage level at the flash memory cell can be increased. For example, a multi-level flash memory cell can include any number of L-levels. The number of data write operations 114 to a multi-level memory cell of L-levels is then L-1 data write operations before an erase operation 116 is executed. In the example 124, memory cell 122 is a four-level memory cell having four corresponding voltage levels, and the memory cell can be programmed three times before an erase operation is executed.

If the voltage level at the flash memory cell can be increased (i.e., "yes" from block 408), then at block 410, the voltage level at the flash memory cell is set to program the flash memory cell for the data write operation. In example 124, the current data bit stored in the memory cell at 136 is programmed as a logical data bit one at 148 for a data write operation of one (e.g., the 1 data bit transition from the memory cell at 136 to 148). Programming the memory cell as the logical data bit one at 148 corresponds to an increased voltage level V4 at the floating gate of the transistor to represent a data value of 1,1 which corresponds to state-3 of the memory cell.

If the voltage level at the flash memory cell can not be increased (i.e., "no" from block 408), then at block 412, the flash memory cell is erased. The method can then optionally continue at block 410 to set the voltage level at the flash memory cell to program the data write operation, and then continue at block 402 to receive a subsequent data write operation to program the flash memory cell when a subsequent data write operation is initiated.

Figure 5:
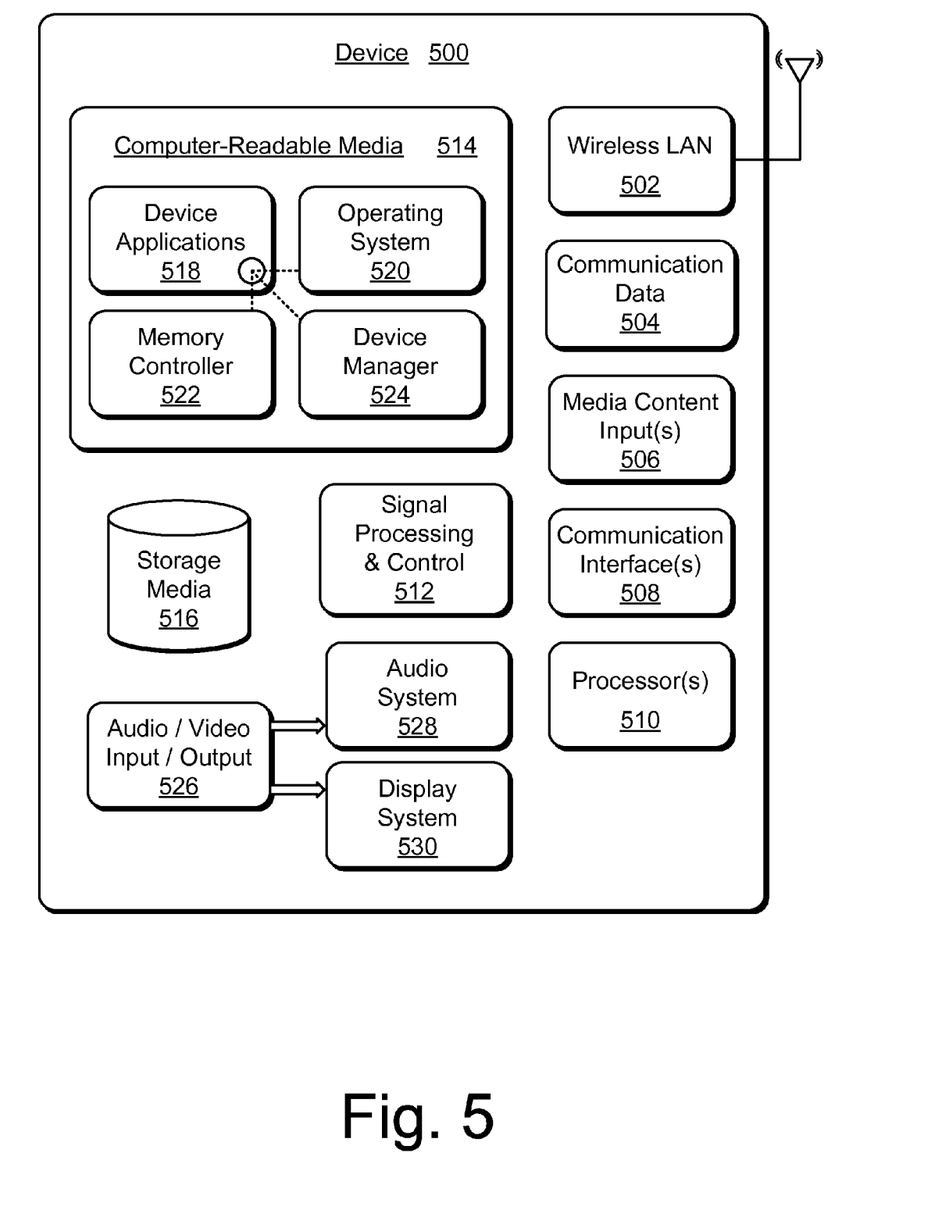
FIG. 5 illustrates various components of an example device that can implement embodiments of flash memory stored data modification.

FIG. 5 illustrates various components of an example device 500 that can be implemented as any type of device that includes a flash memory system and/or various embodiments of flash memory stored data modification. For example, device 500 can be implemented to include example flash memory system 100 shown in FIG. 1 and/or can include the system-on-chip (SoC) 200 shown in FIG. 2. In embodiments, device 500 can be implemented as any one or combination of a media device, computer device, communication device, television set-top box, video processing and/or rendering device, appliance device, gaming device, electronic device, vehicle, workstation, access point, and/or as any other type of device. The device 500 may also be associated with a user (i.e., a person) and/or an entity that operates the device such that a device describes logical devices that include users, software, firmware, and/or a combination of devices.

Device 500 includes wireless LAN (WLAN) components 502, that enable wireless communication of communication data 504 (e.g., received communication data, communication data that is being received, communication data scheduled for broadcast, data packets of the communication data, etc.). Device 500 can also include one or more media content inputs 506 via which any type of media content can be received, such as music, television media content, video content, and any other type of audio, video, and/or image media content received from a media content source which can be processed, rendered, and/or displayed for viewing.

Device 500 can also include communication interfaces 508 that can be implemented as any one or more of a serial and/or parallel interface, a wireless interface, any type of network interface, a modem, and as any other type of communication interface. A wireless interface enables device 500 to receive control input commands and other data from an input device, such as from a remote control device, a portable computing-based device (such as a cellular phone), or from another infrared (IR) or similar RF input device.

Device 500 can also include one or more processors 510 (e.g., any of microprocessors, controllers, and the like) which process various computer-executable instructions to control the operation of device 500, to communicate with other electronic and computing devices, and to implement embodiments of flash memory stored data modification. Alternatively or in addition, device 500 can be implemented with any one or combination of hardware, firmware, or fixed logic circuitry that is implemented in connection with signal processing and control circuits which are generally identified at 512.

Device 500 can include computer-readable media 514, such as one or more memory components, examples of which include random access memory (RAM), non-volatile memory (e.g., any one or more of a read-only memory (ROM), flash memory, EPROM, EEPROM, etc.), and a disk storage device. A disk storage device can include any type of magnetic or optical storage device, such as a hard disk drive, a recordable and/or rewriteable compact disc (CD), any type of a digital versatile disc (DVD), and the like. Device 500 can also include a mass storage media device 516.

Computer-readable media 514 provides data storage mechanisms to store the communication data 504, as well as various device applications 518 and any other types of information and/or data related to operational aspects of device 500. For example, an operating system 520 can be maintained as a computer application with the computer-readable media 514 and executed on processors 510. In one or more embodiments, the device applications 518 can also include a memory controller 522 and/or a device manager 524 when device 500 is implemented to include a flash memory system to implement various embodiments of flash memory stored data modification. In this example, the device applications 518 are shown as software modules and/or computer applications.

Device 500 can also include an audio and/or video input/output system 526 that provides audio data to an audio system 528 and/or provides video data to a display system 530. The audio system 528 and/or the display system 530 can include any devices that process, display, and/or otherwise render audio, video, and image data. Video signals and audio signals can be communicated from device 500 to an audio device and/or to a display device via an RF (radio frequency) link, S-video link, composite video link, component video link, DVI (digital video interface), analog audio connection, or other similar communication link. In an embodiment, audio system 528 and/or the display system 530 can be implemented as external components to device 500. Alternatively, the audio system 528 and/or the display system 530 can be implemented as integrated components of example device 500.

Although not shown, device 500 can include a system bus or data transfer system that couples the various components within the device. A system bus can include any one or combination of different bus structures, such as a memory bus or memory controller, a peripheral bus, a universal serial bus, and/or a processor or local bus that utilizes any of a variety of bus architectures.

Although embodiments of flash memory stored data modification have been described in language specific to features and/or methods, it is to be understood that the subject of the appended claims is not necessarily limited to the specific features or methods described. Rather, the specific features and methods are disclosed as example implementations of flash memory stored data modification.

The invention claimed is:
1. A flash memory system comprising:
a flash memory having a plurality of memory cells; and
a memory controller in communication with the flash memory, wherein the memory controller is configured to

(i) perform a first write operation to write first data to a first multiple-write flash memory cell of the plurality of memory cells, and (ii) subsequent to performing the first write operation, perform a second write operation to write second data to the first multiple-write flash memory cell of the plurality of memory cells, wherein the memory controller is configured to perform the second write operation to write the second data to the first multiple-write flash memory cell of the plurality of memory cells without having to first perform an erase operation to erase the first data written to the first multiple-write flash memory cell of the plurality of memory cells.

2. The flash memory system of claim 1, wherein the memory controller is further configured to:

subsequent to performing the second write operation, perform a third write operation to write third data to the first multiple-write flash memory cell of the plurality of memory cells, wherein the memory controller is configured to perform the third write operation to write the third data to the first multiple-write flash memory cell of the plurality of memory cells without having to first perform an erase operation to erase either of the first data or the second data written to the first multiple-write flash memory cell of the plurality of memory cells.

3. The flash memory system of claim 2, wherein the first multiple-write flash memory cell of the plurality of memory cells is a four-level memory cell having four corresponding threshold voltage levels.

4. The flash memory system of claim 3, wherein each of the first data, the second data, and the third data corresponds to one data bit.

5. The flash memory system of claim 1, wherein the memory controller is further configured to:

perform a fourth write operation to write fourth data to a second memory cell of the plurality of memory cells; and subsequent to performing the fourth write operation, perform a fifth write operation to write fifth data to the second memory cell of the plurality of memory cells, wherein prior to the memory controller performing the fifth write operation to write the fifth data to the second memory cell of the plurality of memory cells, the memory controller is configured to perform an erase operation to erase the fourth data written to the second memory cell of the plurality of memory cells.

6. The flash memory system of claim 5, wherein each of the first data and the second data is expected to be modified more frequently than either of the fourth data or the fifth data.

7. The flash memory system of claim 1, wherein the flash memory comprises one or more of a NAND flash memory, a NOR flash memory, or a NROM flash memory.

8. A system-on-chip (SoC) comprising:
the flash memory system of claim 1;
and a microprocessor in communication with the flash memory system.

9. An electronic device comprising the system-on-chip (SoC) of claim 8.

10. The electronic device of claim 9, wherein the electronic device comprises one or more of a media device, a computer device, a television set-top box, an appliance device, a gaming device, or a workstation.

11. A method for writing data in a flash memory having a plurality of memory cells, the method comprising:

performing a first write operation to write first data to a first multiple-write flash memory cell of the plurality of memory cells; and subsequent to performing the first write operation, performing a second write operation to write second data to the first multiple-write flash memory cell of the plurality of memory cells, wherein second write operation to write the second data to the first multiple-write flash memory cell of the plurality of memory cells is performed without having to first perform an erase operation to erase the first data written to the first multiple-write flash memory cell of the plurality of memory cells.

12. The method of claim 11, further comprising:

subsequent to performing the second write operation, performing a third write operation to write third data to the first multiple-write flash memory cell of the plurality of memory cells, wherein the third write operation to write the third data to the first multiple-write flash memory cell of the plurality of memory cells is performed without having to first perform an erase operation to erase either of the first data or the second data written to the first multiple-write flash memory cell of the plurality of memory cells.

13. The method of claim 12, wherein the first multiple-write flash memory cell of the plurality of memory cells is a four-level memory cell having four corresponding threshold voltage levels.

14. The method of claim 13, wherein each of the first data, the second data, and the third data corresponds to one data bit.

15. The method of claim 11, further comprising:

performing a fourth write operation to write fourth data to a second memory cell of the plurality of memory cells; and subsequent to performing the fourth write operation, performing a fifth write operation to write fifth data to the second memory cell of the plurality of memory cells, wherein prior to performing the fifth write operation to write the fifth data to the second memory cell of the plurality of memory cells, the method further includes performing an erase operation to erase the fourth data written to the second memory cell of the plurality of memory cells.

16. The method of claim 15, wherein each of the first data and the second data is expected to be modified more frequently than either of the fourth data or the fifth data.

17. The method of claim 11, wherein the flash memory comprises one or more of a NAND flash memory, a NOR flash memory, or a NROM flash memory.

18. A computer-readable media comprising instructions, tangibly stored upon the computer-readable media, for writing data to a flash memory having a plurality of memory cells, wherein the instructions are executable by a processor to cause the processor to:

perform a first write operation to write first data to a first multiple-write flash memory cell of the plurality of memory cells; and subsequent to performing the first write operation, perform a second write operation to write second data to the first multiple-write flash memory cell of the plurality of memory cells, wherein the second write operation to write the second data to the first multiple-write flash memory cell of the plurality of memory cells is performed without having the processor first perform an erase operation to erase the first data written to the first multiple-write flash memory cell of the plurality of memory cells.

19. The computer-readable media of claim 18, wherein the instructions are further executable by the processor to cause the processor to:
  subsequent to performing the second write operation, perform a third write operation to write third data to the first multiple-write flash memory cell of the plurality of memory cells,
  wherein the third write operation to write the third data to the first multiple-write flash memory cell of the plurality of memory cells is performed without having the processor first perform an erase operation to erase either of the first data or the second data written to the first multiple-write flash memory cell of the plurality of memory cells.

20. The computer-readable media of claim 19, wherein each of the first data, the second data, and the third data corresponds to one data bit.

* * * * *